United States Patent [19]

Luryi

[11] Patent Number: 4,769,341

[45] Date of Patent: Sep. 6, 1988

[54] METHOD OF FABRICATING NON-SILICON MATERIALS ON SILICON SUBSTRATE USING AN ALLOY OF SB AND GROUP IV SEMICONDUCTORS

[75] Inventor: Sergey Luryi, Passaic Township, Morris County, N.J.

[73] Assignee: American Telephone and Telegraph Company, AT&T Bell Laboratories, Murray Hill, N.J.

[21] Appl. No.: 947,051

[22] Filed: Dec. 29, 1986

[51] Int. Cl.$^4$ .................... H01L 21/203; H01L 21/20
[52] U.S. Cl. .................................... 437/106; 437/107; 437/110; 437/126; 437/128; 437/132; 437/976; 148/DIG. 72; 148/DIG. 97; 148/DIG. 160; 148/DIG. 169; 357/16; 156/610; 156/612
[58] Field of Search ............... 437/103, 106, 104, 936, 437/905, 102; 156/610-614; 148/DIG. 48, 169, 160, 67; 357/16

[56] References Cited

U.S. PATENT DOCUMENTS

| | | | |
|---|---|---|---|
| 3,626,257 | 12/1971 | Esaki | 148/DIG. 160 |
| 3,626,328 | 12/1971 | Esaki | 148/DIG. 160 |
| 4,088,515 | 5/1978 | Blakeslee et al. | 357/16 |
| 4,120,706 | 10/1978 | Mason | 437/104 |
| 4,159,214 | 6/1979 | Mason | 437/104 |
| 4,180,825 | 12/1979 | Mason | 357/16 |
| 4,378,259 | 3/1983 | Hasegawa et al. | 437/905 |
| 4,529,455 | 7/1985 | Bean et al. | 437/106 |
| 4,630,083 | 12/1986 | Yamakoshi | 357/16 |
| 4,675,708 | 6/1987 | Onabe | 357/16 |

OTHER PUBLICATIONS

Bean et al., "Pseudomorphic Growth of $Ge_xSi_{1-x}$ on Silicon by Molecular Beam Epitaxy", Appl. Phys. Lett., 44(1), Jan. 1, 1984, pp. 102-104.

Bean, "Recent Developments in the Strained Layer Epitaxy of Germanium-Silicon Alloys", J. Vac. Sci. Technol. B 4(6), Nov./Dec. 1986, pp. 1427-1429.

Parker, The Technology & Physics of Molecular Beam Epitaxy, Plenum Publishing, New York, NY, Sep. 1985, pp. 179-181 & 667-669.

Primary Examiner—Brian E. Hearn
Assistant Examiner—William Bunch
Attorney, Agent, or Firm—Richard D. Laumann

[57] ABSTRACT

A semiconductor device comprising an epitaxially grown tin and Group IV compound semiconductor region on which at least one other semiconductor is grown lattice matched to the adjacent portion of the tin containing region. A large number of semiconductors may thus be grown.

6 Claims, 2 Drawing Sheets

METHOD OF FABRICATING NON-SILICON MATERIALS ON SILICON SUBSTRATE USING AN ALLOY OF SB AND GROUP IV SEMICONDUCTORS

TECHNICAL FIELD

This invention relates generally to semiconductor devices and particularly to a method of fabricating such devices in which a non-silicon semiconductor is grown over a silicon substrate with the lattice constant mismatch between the non-silicon semiconductor and the silicon substrate being accommodated by an intermediate region which utilizes tin as a major component.

BACKGROUND OF THE INVENTION

Silicon is the semiconductor most commonly used for integrated circuits, and silicon integrated circuit technology is presently extremely well developed. The dominant position of silicon in the integrated circuit markets is partially due to the fact that it is both abundant and relatively inexpensive as compared to other semiconductors such as Group III-V compound semiconductors. For example, silicon wafers or substrates are presently approximately in order of magnitude cheaper than are GaAs wafers. The integrated circuit or other device is often fabricated using an epitaxial layer of silicon which is grown on the silicon substrate although the circuit may be fabricated directly on the wafer.

However, for a variety of reasons, it is often desirable to have epitaxial semiconductors other than silicon on silicon substrates. In pursuing this direction, the objective is to enhance the range of useful devices which can be fabricated using silicon substrates. For example, some semiconductors, such as Group III-V compound semiconductors, may lead to devices in which the carrier mobility is higher than it is in silicon devices or they may make it possible to integrate optical functions with electronic functions on the same substrate. In the latter case, it is contemplated that Group IV, III-V, II-VI or other compound, as well as non-silicon elemental, semiconductors will be used to fabricate optical devices while the electronic functions will be performed either by devices fabricated in silicon or in the epitaxial layers of the non-silicon semiconductor. Compound semiconductors are preferred over silicon for the optical functions because they often have a direct bandgap, while silicon has an indirect bandgap, and have bandgaps which extend over a wide range of wavelengths. The latter feature permits fabrication of optical devices, e.g., lasers and photodetectors, which are useful over a broad range of wavelengths including the visible and the infrared. This approach to device fabrication thus combines the low cost, easy handling, ready avalability, etc., of silicon substrates as well as the mature Si very large scale integration technology with the desirable attributes offered by other semiconductors.

However, growth of high quality non-silicon semiconductors on silicon substrates is generally extremely difficult because the desired non-silicon semiconductors typically have lattice constants that differ significantly from that of silicon, and high quality epitaxial growth is thus difficult to obtain because of the lattice constant mismatch. When utilization of the heterointerface is not required, various intermediate layers may be grown provided that the top layers where the devies will be located are of the desired device quality. Although there are many pitfalls in the path of this development, some, e.g., such as the possible chemical incompatibility of the two materials or their different lattice symmetry, are not directly related to the lattice mismatch. The latter, which is the concern of this application, manifests itself adversely by generating misfit dislocations, which thread the epitaxial layers, thus degrading their quality.

One approach to increasing the number of semiconductors which may be grown with a high degree of crystalline perfection on a particular type of substrate is to use a strained layer superlattice between the substrate and the desired semiconductor. A strained layer superlattice consists of a plurality of interleaved layers having different compositions and lattice constants with the strain produced by the lattice constant mismatch between the two semiconductors being accommodated by distortion of the lattice rather than by generation of misfit dislocations. For example, a plurality of GaAs layers may be interleaved with a plurality of AlGaAs layers.

Strained layer superlattices may also be used in a different context which has been used successfully with, for example, GeSi superlattices grown on, for example, Si substrates. A compositionally graded layer may be grown between the substrate and the superlattice. The lattice constant of the compositionally graded layer varies from that of the substrate to that of the desired compound semiconductor. The misfit dislocations that arise because of the lattice mismatch between the compositionally graded layer and the substrate often have their propagation terminated in the superlattice. Although the reason for this behavior is not presently known with absolute certainty, it is likely to be associated with the additional strain introduced by the superlattice which makes the threading propagation of a dislocation unfavorable. Thus, the misfit dislocations generated by the compositionally graded layer are trapped in the superlattice, and homogeneous alloy layers grown above the superlattice may now be used as a substrate for the epitaxial growth of additional semiconductor layers which are lattice matched to those alloy layers rather than the substrate.

Although many combinations of semiconductors have been proposed for the strained layer superlattices, one combination of semiconductors that has not received any attention from those skilled in the art is the combination of tin and another Group IV semiconductor. The use of tin appears especially attractive because it has a lattice constant of 0.6489 nm as opposed to 0.5431 or 0.5646 nm for silicon or germanium, respectively. Such a large lattice constant difference opens the possibility of epitaxially growing many types of compound semiconductors on a SiSn or GeSn alloy layer grown on a silicon or germanium substrate after a superlattice has been used to trap the misfit dislocations. However, those skilled in the art have studiously avoided the use of such tin containing superlattices. It was believed that solid alloys of tin with Ge or Si could not be grown successfully because solid solutions of tin with the other Group IV elements exhibit segregation when cooled from the melt.

SUMMARY OF THE INVENTION

A region comprising tin and at least one other Group IV semiconductor permits the epitaxial growth of semiconductors, and thus the fabrication of devices in these semiconductor materials, within a wide range of lattice constants over either Si or Ge substrates. The device comprises: in sequence, a substrate comprising at least one semiconductor selected from the group consisting of Si and Ge; a region comprising tin and at least one other Group IV semiconductor; and a region comprising at least one non-silicon semiconductor in which desired devices are fabricated. The latter region is approximately lattice matched to the top of the tin containing region. The tin comprising region comprises a compositionally graded region in which the percentage of tin increases, i.e., a region of $Sn_xSi_{1-x}$ with x increasing from 0.0 to a value of $x_o$, such that the lattice constant of the $Sn_{x_o}Si_{1-x}$ alloy matches that of the desired epitaxial semiconductor, and a superlattice comprising interleaved layers of $Sn_x$ Group $IV_{1-x}$ and $Sn_y$ Group $IV_{1-y}$ compound semiconductors with the values of x and y selected so that the average lattice constant of the superlattice is close to the lattice constant of the non-silicon semiconductor. The superlattice region traps the misfit dislocations generated in the growth of the compositionally graded region. Other substrate compositions may be used.

The tin comprising region is preferably grown by molecular beam epitaxy which is a low temperature growth process. Because of this, it is a nonequilibrium process in which segregation of tin from the other Group IV element does not occur resulting in a metastable heterostructure. The resulting alloy is metastable.

DETAILED DESCRIPTION

Figure 1:
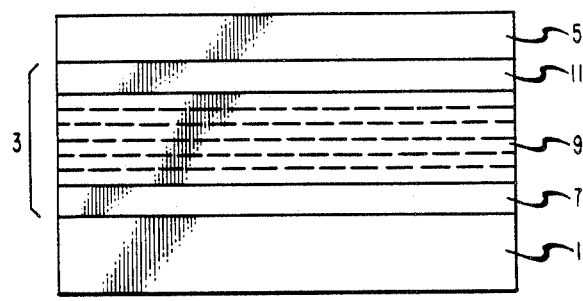
FIG. 1 is a schematic view of a semiconductor device according to this invention.

An exemplary embodiment of a device according to this invention is depicted in FIG. 1. The device comprises substrate 1; tin containing region 3 and non-silicon semiconductor region 5. The tin containing region comprises a region 7 having a graded composition, a superlattice region 9, and a buffer region 11. The superlattice comprises a plurality of layers as shown by the dotted lines. For reasons of clarity, only several layers are shown although it is to be understood that many more will usually be present in the actual structure. The substrate comprises, in a preferred embodiment, at least one semiconductor selected from the group consisting of Si and Ge. Other compositions may be used. Si substrates are presently preferred because of their high quality and easy availability. The tin (Sn) containing region comprises Sn and at least one other Group IV semiconductor. That is, it comprises Sn and at least one semiconductor selected from the group consisting of Group IV semiconductors including Si, Ge and C. Non-silicon semiconductor region 5 is approximately lattice matched to the buffer region 11 on the superlattice. The choice of semiconductor for region 5 will be discussed later. Of course, region 5 may comprise more than one semiconductor. For example, a plurality of epitaxial layers lattice matched to each other but having different compositions may be grown.

Figure 2:
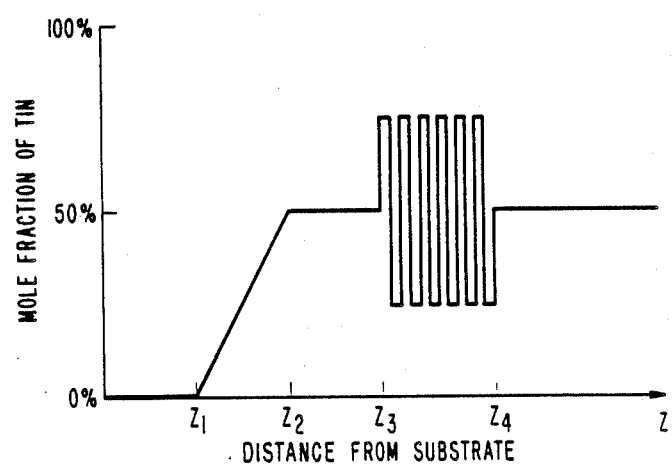
FIG. 2 plots the mole fraction of tin vertically versus the distance from the substrate horizontally for a typical varying composition region according to this invention.

The structure of the tin comprising region will be better understood by reference to FIG. 2 which plots the mole fraction of tin vertically in the $Sn_xSi_{1-x}$ alloy versus the distance horizontally, in arbitrary units, from the substrate for the tin comprising region for one embodiment, namely, $Sn_{0.5}Si_{0.5}$. This embodiment is selected solely for purposes of illustration. As will be readily appreciated by those skilled in the art, other alloy compositions may be used depending upon the desired lattice constant. The region depicted is grown on a Si substrate. A Si buffer layer is present from $Z_0$ to $Z_1$, and a compositionally graded layer is present from $Z_1$ to $Z_2$. The composition at $Z_2$ has the lattice constant desired for the non-silicon semiconductor region 5. The superlattice region extends from $Z_3$ to $Z_4$. A SnSi buffer layer is grown before the superlattice. Of course, the layers in the superlattice must be sufficiently thin so that misfit dislocations do not become energetically favorable, i.e., the lattice mismatch is accommodated by strain rather than by the generation of misfit dislocations. During growth of the graded composition region, that is, the region extending from $Z_1$ to $Z_2$, misfit dislocations are generated. However, during the growth of the superlattice, that is, the structure extending from $Z_3$ to $Z_4$, the misfit dislocations are trapped with the strained layer region. Consequently, the region from $Z_4$ upwards is free of dislocations. In the example depicted, the metastable alloy has a lattice constant of approximately 0.596 nm. For other lattice constants, the mole fraction of tin in the superlattice will be selected to give the desired lattice constant.

In a preferred embodiment, the superlattice region comprises interleaved layers of $Sn_{1-x}Si_x$ in which x is larger in the first plurality of interleaved layers than it is in the second plurality of interleaved layers. The choice of the two values of x within the superlattice region is dictated by the requirement that the superlattice region trap the misfit dislocations generated during the growth of the graded composition region. More generally, the superlattice region comprises $Sn_x$ Group $IV_{1-x}$ where Group IV is at least one Group IV elemental semiconductor.

Figure 3:
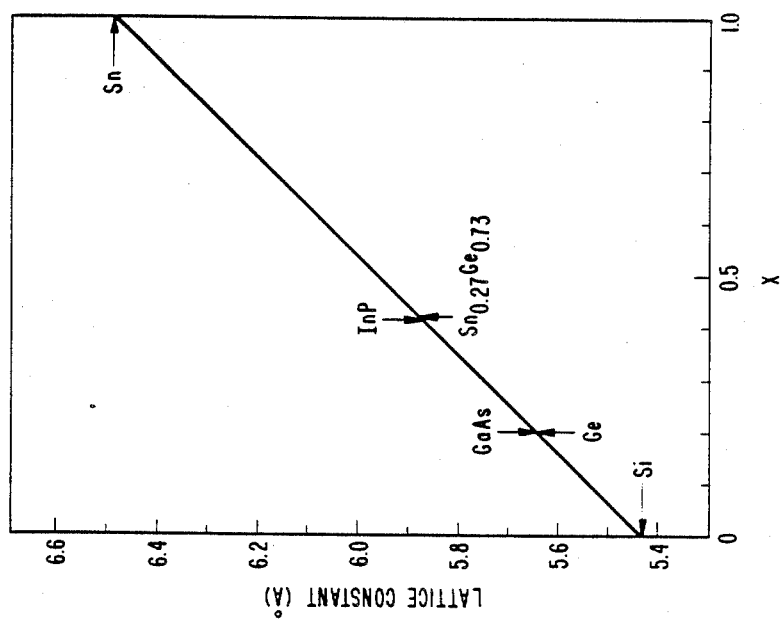
FIG. 3 plots the lattice constant in units of angstroms vertically versus the percentage of tin horizontally for $Sn_xSi_{1-x}$ alloys.

The ultimate value of Sn in the graded composition region is determined by the lattice constant of the compound semiconductor region grown on the superlattice. That is, the two lattice constants should be approximately equal. FIG. 3 plots the lattice constant vertically in Angstroms versus the tin fraction horizontally in units of x for selected semiconductors. Ten Angstroms equals 1 nm. Semiconductors whose lattice constants are depicted include Ge, GaAs, InP, and $Sn_{0.27}Ge_{0.73}$. The positions of other semiconductors on this graph will be readily known to those skilled in the art and therefore need not be shown. Growth of Group II-VI, III-V, as well as mixed group semiconductors is contemplated.

As $Sn_xSi_{1-x}$ alloys exhibit phase segregation when cooled from a bulk solution, it is necessary that the Sn containing regions be grown by a non-equilibrium process. A non-equilibrium process is defined as any process which lacks sufficient kinetic energy for phase segregation to occur growth. The alloy layer will then be metastable, i.e., its constituents lack the energy required to overcome the kinetic barrier and reach the minimum energy, phase-segregated state. A low temperature epitaxial growth, such as molecular beam epitaxy, is presently preferred. Growth at temperatures less than approximately 500° C. is desirable. However, it is possible that other growth techniques, such as chemical vapor deposition or metalloorganic chemical vapor deposition, may also proceed at a temperature sufficiently low that phase segregation does not arise. The upper limit on x within the superlattice region is determined by the thermal stability in the epitaxial layer at the growth temperatures, and also, possibly, by the requirement of having a sufficient glitch amplitude over the average alloy composition. It appears unlikely that the technique will be useful for values of x greater than approximately 0.6.

Figure 4:
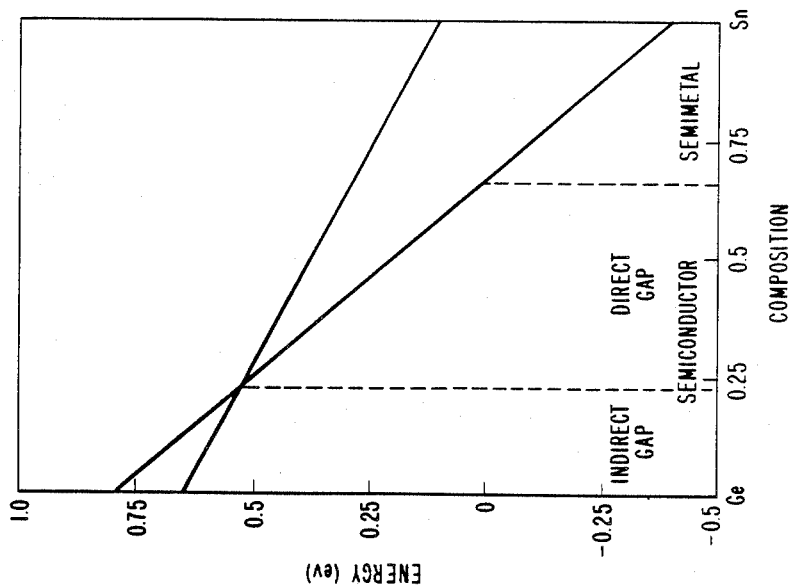
FIG. 4 plots the energy vertically in units of eV versus the composition horizontally for $Sn_xGe_{1-x}$ alloys.

Although growth of $Sn_xSi_{1-x}$ alloys in region 5 on Si substrates is the preferred way of practicing this invention, other embodiments are contemplated. For example, region 5 may comprise a $Sn_xGe_{1-x}$ alloy with either a Si or Ge substrate. This alloy, especially with x greater than approximately 0.27, is of particular interest because it is believed to be a direct bandgap semiconductor. If desired, this alloy may be grown directly on an InP substrate to which it is approximately lattice matched. FIG. 4 plots the energy of the bandgap vertically in units of eV versus the composition horizontally in units of x. The regions of the indirect and direct bandgaps are shown as well as the regions in which the alloy becomes a semi-metal. It is noted that $Sn_xGe_{1-x}$ also does not exist in the equilibrium bulk form because of phase segregation. For values of x greater than approximately 0.25, the alloy will have a conduction band minimum in $k=0$ valley and therefore one can expect a high electron mobility as well as low effective mass. It is also noted that this direct bandgap material offers the possibility fabricating long wavelength, that is, greater than 2.5 um, optical devices including photodetectors and light sources such as light emitting diodes and lasers. The SnGe layer may be used as a substrate for the growth of further layers or devices may be fabricated directly in the SnGe layer.

The devices contemplated for the compound semiconductor region are numerous and include integrated circuits, oscillators, photodetectors, lasers, etc.

What is claimed is:

1. A method of fabricating a semiconductor device comprising the steps of:
    growing a compositionally graded crystalline region comprising alloy of Sn and at least on other semiconductor selected from the group consisting of Group IV semiconductors by a non-equilibrium process or a substrate; and
    growing a semiconductor region approximately lattice matched to the adjacent portion of said Sn comprising region.

2. A method as recited in claim 1 in which said non-equilibrium process comprises molecular beam epitaxy.

3. A method as recited in claim 2 in which said process proceed at a temperature less than 500° C.

4. A method as recited in claim 3 in which said crystalline region comprising Sn comprises a superlattice region.

5. A method as recited in claim 1 in which said substrate comprises a composition related from the group consisting of Si and Ge.

6. A method as recited in claim 5 in which said substrate comprises Si.

* * * * *

UNITED STATES PATENT AND TRADEMARK OFFICE
CERTIFICATE OF CORRECTION

PATENT NO. : 4,769,341

DATED : September 6, 1988

INVENTOR(S) : Sergey Luryi

It is certified that error appears in the above-identified patent and that said Letters Patent is hereby corrected as shown below:

On the title page, item [54] and in column 1, line 4, in the title "SB" should read --Sn--.

Signed and Sealed this

Ninth Day of January, 1990

*Attest:*

JEFFREY M. SAMUELS

*Attesting Officer*  *Acting Commissioner of Patents and Trademarks*